US006204508B1

(12) United States Patent
Chen et al.

(10) Patent No.: US 6,204,508 B1
(45) Date of Patent: Mar. 20, 2001

(54) TOROIDAL FILAMENT FOR PLASMA GENERATION

(75) Inventors: Jiong Chen; Ronald A. Capodilupo, both of Beverly; Scott Barusso, Gloucester; Philip J. Ring; Kui Jin, both of Beverly, all of MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/130,662

(22) Filed: Aug. 7, 1998

(51) Int. Cl.[7] .................................................. H01J 37/317

(52) U.S. Cl. ................................ 250/423 R; 250/423 F; 250/492.21

(58) Field of Search ............................... 750/423 R, 424, 750/427, 423 F, 492.21, 251; 313/271, 272, 273, 279, 341

(56) References Cited

U.S. PATENT DOCUMENTS

| | | | | |
|---|---|---|---|---|
| 4,804,837 | | 2/1989 | Farley | 250/251 |
| 4,882,520 | | 11/1989 | Tsunekawa et al. | 313/643 |
| 4,918,354 | | 4/1990 | Johnson, Jr. | 313/279 |
| 4,935,662 | | 6/1990 | Kachenmeister, Jr. | 313/279 |
| 5,497,006 | | 3/1996 | Sferlazzo et al. | 250/427 |
| 5,554,852 | * | 9/1996 | Bright et al. | 250/492.21 |
| 5,680,003 | | 10/1997 | Hartwick et al. | 313/271 |
| 5,808,308 | * | 9/1998 | Holkeboer | 250/423 R |
| 5,856,674 | * | 1/1999 | Kellerman | 250/423 F |

* cited by examiner

*Primary Examiner*—Kiet T. Nguyen
(74) *Attorney, Agent, or Firm*—John A. Kastelic

(57) ABSTRACT

A filament (18) for an ion implanter ion source or plasma shower is provided comprising first and second legs (20*a*, 20*b*) and a thermally emissive central portion (40) having ends connected, respectively, to the first and second legs. Preferably, the legs (20*a*, 20*b*) are constructed from tantalum (Ta), and the thermally emissive portion (40) is constructed of tungsten (W). The thermally emissive portion is coiled substantially along the entire length thereof and formed in the shape of a generally closed loop, such as a toroid. The toroid is comprised of two toroid halves (40*a*, 40*b*) coiled in opposite directions. The toroid halves are constructed of a plurality of filament strands (42, 44, 46) twisted together along substantially the entire length thereof. The coils of the toroid are capable of establishing closed loop magnetic field lines (B) therein when electrical current flows through the thermally emissive portion. The closed loop magnetic field lines (B) confine electrons (E) emitted from the surface of the thermally emissive portion within the confines of the coils.

8 Claims, 3 Drawing Sheets

TOROIDAL FILAMENT FOR PLASMA GENERATION

FIELD OF THE INVENTION

The present invention relates generally to plasma generation sources for ion implantation equipment, and more specifically to a toroidal filament for use in such sources.

BACKGROUND OF THE INVENTION

Ion implantation has become a standard accepted technology of industry to dope workpieces such as silicon wafers or glass substrates with impurities in the large scale manufacture of items such as integrated circuits and flat panel displays. Conventional ion implantation systems include an ion source that ionizes a desired dopant element which is then accelerated to form an ion beam of prescribed energy. The ion beam is directed at the surface of the workpiece to implant the workpiece with the dopant element. The energetic ions of the ion beam penetrate the surface of the workpiece so that they are embedded into the crystalline lattice of the workpiece material to form a region of desired conductivity. The implantation process is typically performed in a high vacuum process chamber which prevents dispersion of the ion beam by collisions with residual gas molecules and which minimizes the risk of contamination of the workpiece by airborne particulates.

Ionized plasma is generated in a typical ion implanter in at least two separate locations. First, at the front end of an ion implanter, an ion source generates a plasma, from which an ion beam may be extracted, by ionizing an inert gas. An example of such an ion source is shown in U.S. Pat. No. 5,497,006 to Sferlazzo, et al., assigned to the assignee of the present invention and incorporated by reference as if fully set forth herein.

A simplified diagram of an ion source is shown in FIG. 1. A gas such as boron or phosphorous is input into an arc chamber AC via an inlet I and exposed to an energized filament F. The filament emits high-energy electrons E which are repelled by repeller R to confine the electrons to an ionization region between the filament and the repeller. The deflected electrons E collide with ionizable gas molecules in the ionization region, where the probability of collision with ionizable gas molecules is maximized. In this manner, a plasma is created comprised at least partially of positively charged ions. A generally positively charged ion beam is drawn from this plasma, typically through a source aperture SA in the arc chamber.

In addition to the repeller, a typical ion source also includes source magnets, as shown in FIG. 1 (power supplies not shown). The source magnets SM create a magnetic field across the arc chamber AC. The magnetic field alters the spiral path P of the electrons E emitted by the filament F and traveling through the arc chamber, in a well known manner, thereby increasing the probability of collisions with the ionizable gas molecules provided through inlet I and confined between the filament F and the repeller R. The source magnet SM current is adjusted to maximize ion beam current and beam quality. Accordingly, the source magnets SM and the repeller R confine the high-energy electrons emitted by the filament to the ionization region.

Also, a plasma is generated downstream in the implanter in a plasma shower. The plasma shower serves to counter the effects of wafer charging that the positively charged ion beam would otherwise have on a wafer being implanted. Such a system is shown in U.S. Pat. No. 4,804,837 to Farley, assigned to the assignee of the present invention and incorporated by reference as if fully set forth herein.

A simplified diagram of a typical plasma shower is shown in FIG. 2. The plasma shower comprises an arc chamber AC into which an inert gas such as argon is input via inlet I and exposed to an energized filament F. The filament emits high-energy electrons E that ionize the inert gas molecules to create a plasma within the arc chamber. The plasma diffuses through aperture A into the path of ion beam B passing through vacuum chamber VC. The plasma aids in neutralizing the net charge of the beam which in turn reduces the positive charge accumulation on the wafer as the ion beam strikes the wafer surface The use of a repeller and a source magnet in an ion source, however, results in added complexity, cost, size, and power consumption of these devices. Further, source magnets create electrical noise that can perturb the plasma within the ion source. In addition, filaments in known plasma showers do not produce plasmas of sufficiently high density due to the lack of a containment mechanism for the high-energy electrons E emitted by the filament F. Moreover, attempts at increasing the plasma density typically require that the filament F consume significant amounts of energy.

Accordingly, it is an object of the present invention to provide a filament for use in a plasma generation source in an ion implanter such as an ion source or a plasma shower, which provides a low-noise, high density plasma while overcoming the deficiencies of known ion or plasma generation sources. It is a further object of the invention to provide a simple, energy efficient, economical and compact mechanism for primary electron confinement in an ion source or plasma shower to create a high density, low-noise plasma.

SUMMARY OF THE INVENTION

A filament for an ion implanter ion source or plasma shower is provided comprising first and second legs and a thermally emissive central portion having ends connected, respectively, to the first and second legs. Preferably, the legs are constructed from tantalum (Ta), and the thermally emissive portion is constructed of tungsten (W).

The thermally emissive portion is coiled substantially along the entire length thereof and formed in the shape of a generally closed loop, such as a toroid. The toroid is comprised of two toroid halves coiled in opposite directions. The toroid halves are constructed of a plurality of filament strands twisted together along substantially the entire length thereof. The coils of the toroid are capable of establishing closed loop magnetic field lines therein when electrical current flows through the thermally emissive portion. The closed loop magnetic field lines confine electrons emitted from the surface of the thermally emissive portion within the confines of the coils.

DETAILED DESCRIPTION OF PREFERRED EMBODIMENTS OF THE INVENTION

Figure 1:
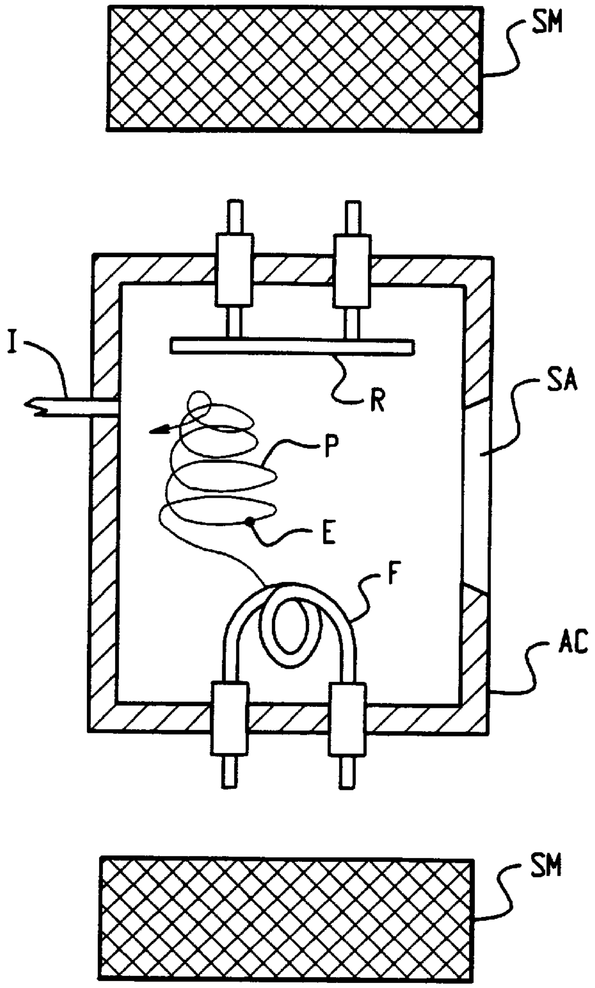
FIG. 1 is a cross sectional view of a conventional ion source for an ion implanter.
Figure 3:
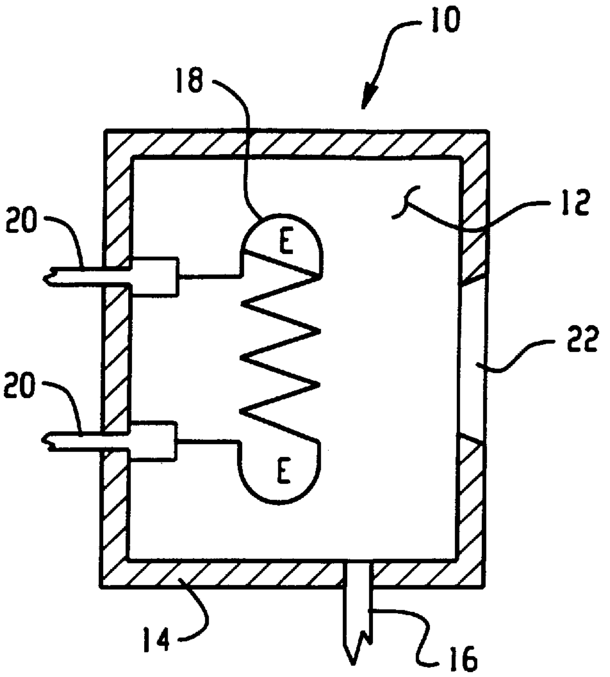
FIG. 3 is a cross sectional view of an ion source for an ion implanter using the filament of the present invention.

Referring now to FIG. 3 of the drawings, a first embodiment of the invention is shown, wherein the invention is incorporated into an ion source 10. The ion source comprises an arc chamber 12 formed by walls 14. An ionizable gas such as boron or phosphorous is input into the arc chamber 12 via inlet 16 and exposed to a filament 18 constructed according to the principles of the present invention. The filament is energized by a power supply (not shown) which applies a voltage across filament legs 20 to create a current flow therein. The filament thereby thermionically emits high-energy electrons E which ionize the gas, creating a plasma which exits the arc chamber via exit aperture 22. The general shape of the filament is a coil formed into the shape of a closed loop which, as explained further below, confines high energy electrons E within the coil, effectively eliminating the need for a repeller or source magnet as shown in the prior art ion source of FIG. 1.

Figure 2:
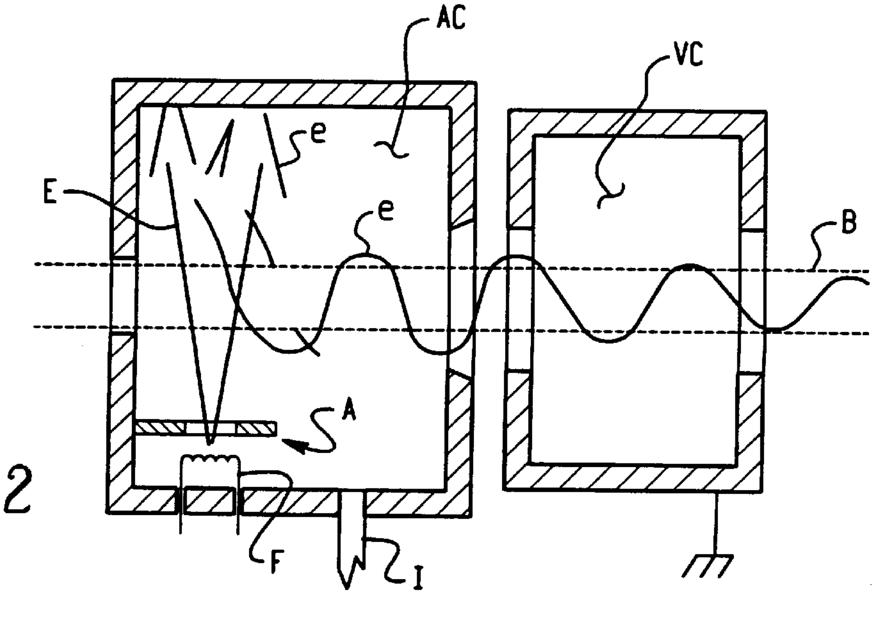
FIG. 2 is a cross sectional view of a conventional plasma shower for an ion implanter.
Figure 4:
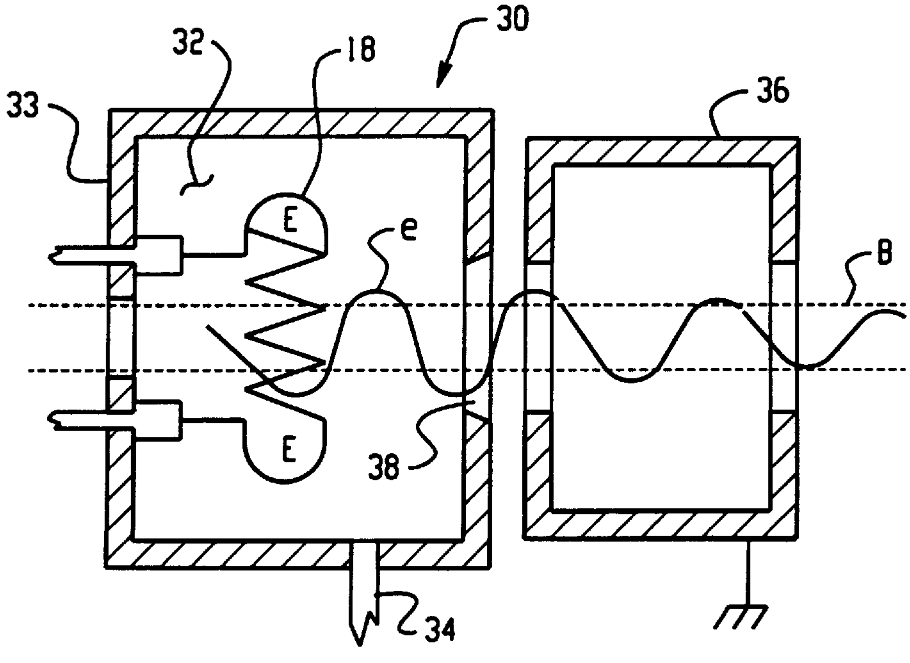
FIG. 4 is a cross sectional view of a plasma shower for an ion implanter using the filament of the present invention.

Referring now to FIG. 4 of the drawings, a second embodiment of the invention is shown, wherein the invention is incorporated into a plasma shower 30. The plasma shower comprises an arc chamber 32 formed by walls 33 into which an inert gas such as argon is input via inlet 34 and exposed to the energized filament 18. The filament emits high-energy electrons E that are trapped within the confines of the coils of the closed loop filament. The high-energy electrons E collide with ionizable gas molecules to create a plasma comprised at least partially of low energy electrons e. The low energy electrons move from the arc chamber 32 through exit aperture 38 to an adjacent vacuum chamber 36 where they become trapped within the ion beam B passing therethrough. Again, the general shape of the filament is a closed loop which, as explained further below, confines high energy electrons E therein, enabling the generation of a high-density plasma within the arc chamber 32, while consuming less power than the prior art plasma shower of FIG. 2.

Figure 5:
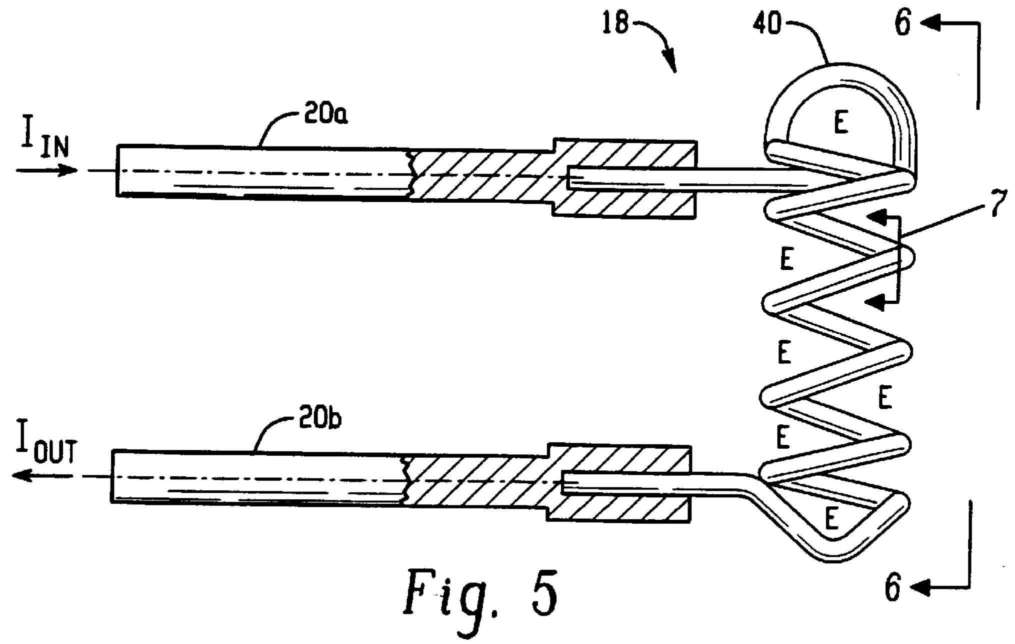
FIG. 5 is a perspective, partially cross sectional view of the filament shown in the ion source of FIG. 3 and the plasma shower of FIG. 4.
Figure 6:
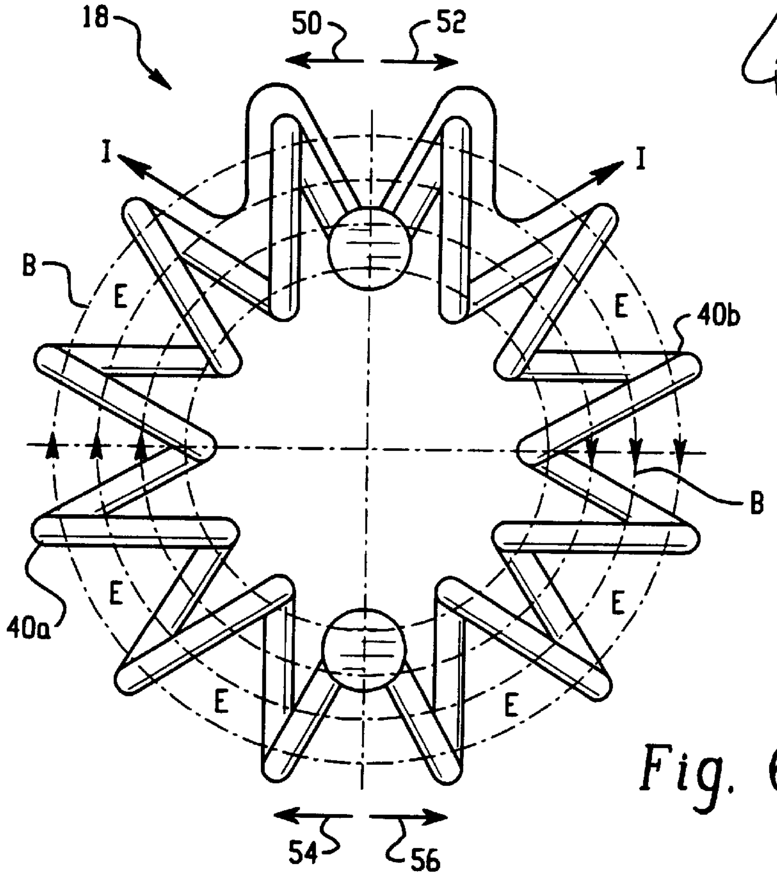
FIG. 6 is perspective view of the filament of FIG. 5, taken along the lines 6—6.
Figure 7:
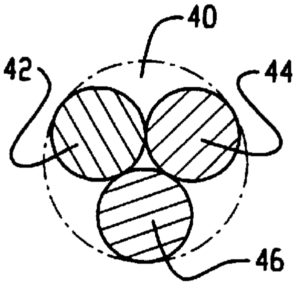
FIG. 7 is a partial cross section of the filament of FIG. 5, taken along the lines 7—7.

The inventive filament 18 used in the devices of FIGS. 3 and 4 is shown in more detail in FIGS. 5 through 7 Referring now to FIG. 5, the filament 18 comprises a pair of legs 20*a* and 20*b* attached to a thermally emissive coiled central portion 40. Preferably the legs are constructed of tantalum (Ta) and the thermally emissive portion is comprised of tungsten (W). The thermally emissive coiled portion 40 may be connected to the legs 20 by welding, press fitting, or crimping. Alternatively, the legs and the coiled portion may be constructed unitarily as a single element. As such, the legs and the coiled portion would be integrally "connected".

By applying a positive voltage differential across the legs 20*a* and 20*b*, an electrical current I flows in through leg 20*a*, through thermally emissive coiled portion 40, and out through leg 20*b*, in the direction shown in FIG. 5. As a result, thermionic emission occurs at the surface of the thermally emissive coiled portion 40, resulting in the emission of high-energy electrons E. Such high-energy electrons E are suitable for ionizing gas molecules colliding therewith.

As shown in FIG. 6, in a preferred embodiment, the thermally emissive coiled portion 40 of filament 18 takes the shape of a toroid. The toroid 40 is comprised of two toroid halves 40*a* and 40*b*, each of which extends between legs 20*a* and 20*b*. Each of the toroid halves is constructed of a stranded grouping of three tungsten filaments, 42, 44 and 46, as shown in the cross sectional view of FIG. 7. Although three filaments are shown in FIG. 7, more or less may be utilized in constructing the toroid halves 40*a* and 40*b*.

The triple filaments (42, 44 and 46) are twisted along their entire lengths. Fixed at both ends at legs 20*a* and 20*b*, the filaments are twisted in a counter clockwise direction when viewed as extending outward from the legs 20 at each end (the view of FIG. 6). The use of a plurality of twisted filaments instead of a single, thicker filament results in a longer filament lifetime due to a finer grain and fewer defects found in such thinner filaments when compared to thicker filaments.

Also, the coil halves 40*a* and 40 are wound in opposite directions when viewed from their respective ends at each leg 20. For example, when viewed from leg 20*a* along line 50, coil half 40*a* is wound in a counter clockwise direction and when viewed along line 52, coil half 40*b* is wound in a clockwise direction. Similarly, when viewed from leg 20*b* along line 54, coil half 40*a* is wound in a counter clockwise direction and when viewed along line 56, coil half 40*b* is wound in a clockwise direction.

In operation, a positive voltage potential is applied across the legs 20*a* and 20*b* to induce current flow in the filament, from leg 20*a* to leg 20*b* via the toroidal thermally emissive portion 40, as shown by the directional arrows I (see FIG. 6). The current flow I through the coiled toroidal halves establishes a magnetic field. Because the coil halves are wound in opposite directions, the magnetic field is characterized by magnetic field lines B within the confines of its coils, as shown in FIG. 6.

Primary electrons E generated by thermal emission of the filament and emitted from the surface thereof spiral in a tight orbit along the magnetic field lines B, around the interior of the toroid coils. Because these magnetic field lines are closed, the high-energy electrons E are confined within the interior of the coils. These primary electrons E are suitable for ionizing gas molecules with which they come into contact in the arc chamber. After numerous collisions with gas molecules in the arc chamber, the high-energy electrons lose sufficient energy to become thermalized low energy electrons, which can escape the confines of the toroidal coils. Any such lower energy electrons can diffuse out from the confines of the toroidal coils and migrate toward the walls of the arc chamber in the ion source or plasma shower of FIGS. 3 and 4, respectively.

The result of the filament design of the present invention is a highly efficient filament which is energized to create a low-noise high density plasma in the arc chamber 12 of the ion source of FIG. 3 or the corresponding arc chamber 32 of the plasma shower of FIG. 4. The plasma is less "noisy" than that which could be generated in the prior art ion source of FIG. 1, because no source magnets are used. Such magnets typically cause a perturbance of the plasma, which perturbance is exaggerated in the case of high-density plasmas due to the required corresponding increased current in the magnets. Accordingly, using the filament 18 of the present invention, the current may be increased (as compared to the filament used in the device of FIG. 1) to create a high density, low-noise plasma.

Although the disclosed embodiments of the invention utilize a twisted grouping of twisted filaments formed into the shape of a coiled, regular toroid, it is to be understood that the invention is not so limited. For example, any shape of coiled single strand filament formed into a generally closed loop may serve the purposes of the present invention.

Accordingly, a preferred embodiment of an improved filament for an ion source or a plasma shower in an ion implanter has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What is claimed is:

1. An ion source (10) for an ion implanter, comprising:

(i) an arc chamber (12) formed by walls (14);

(ii) an inlet (16) for introducing an ionizable gas into said arc chamber;

(iii) an exit aperture (22) from which an ionized plasma may be extracted; and (iv) a filament (18) having first and second legs (20*a*, 20*b*) and a thermally emissive central portion (40) having ends connected, respectively, to said first and second legs, said thermally emissive portion formed into two halves (40*a*, 40*b*) coiled in opposite directions substantially along the entire length thereof and formed in the shape of a generally closed loop, wherein coils of said thermally emissive portion (40) establish closed loop magnetic field lines (B) therein when electrical current flows through said thermally emissive portion, and wherein said closed loop magnetic field lines (B) confine electrons (E) emitted from the surface of said thermally emissive portion (40) within the confines of said coils.

2. The ion source (10) of claim 1, wherein said legs (20*a*, 20*b*) are constructed from tantalum (Ta) and said thermally emissive portion (40) is constructed of tungsten.

3. The ion source (10) of claim 1, wherein said thermally emissive portion (40) is constructed of a plurality of filament strands (42, 44, 46) twisted together along substantially the entire length thereof.

4. The ion source (10) of claim 1, wherein said thermally emissive portion (40) is toroidal in shape.

5. A plasma shower (30) for an ion implanter, comprising:

(i) an arc chamber (32) formed by walls (33);

(ii) an inlet (34) for introducing an ionizable gas into said arc chamber;

(iii) an exit aperture (38) from which an ionized plasma may be extracted; and (iv) a filament (18) having first and second legs (20*a*, 20*b*) and a thermally emissive central portion (40) having ends connected, respectively, to said first and second legs, said thermally emissive portion formed into two halves (40*a*, 40*b*) coiled in opposite directions substantially along the entire length thereof and formed in the shape of a generally closed loop, wherein coils of said thermally emissive portion (40) establish closed loop magnetic field lines (B) therein when electrical current flows through said thermally emissive portion, and wherein said closed loop magnetic field lines (B) confine electrons (E) emitted from the surface of said thermally emissive portion (40) within the confines of said coils.

6. The plasma shower (30) of claim 5, wherein said legs (20*a*, 20*b*) are constructed from tantalum (Ta) and said thermally emissive portion (40) is constructed of tungsten (W).

7. The plasma shower (30) of claim 5, wherein said thermally emissive portion (40) is constructed of a plurality of filament strands (42, 44, 46) twisted together along substantially the entire length thereof.

8. The plasma shower (30) of claim 5, wherein said thermally emissive portion (40) is toroidal in shape.

* * * * *